(12) United States Patent
Ishioka et al.

(10) Patent No.: US 6,861,863 B2
(45) Date of Patent: Mar. 1, 2005

(54) INSPECTION APPARATUS FOR CONDUCTIVE PATTERNS OF A CIRCUIT BOARD, AND A HOLDER THEREOF

(75) Inventors: Shogo Ishioka, Fukayasu-gun (JP); Tatuhisa Fujii, Fukuyama (JP)

(73) Assignee: OHT Inc., Fukayasu-gun (JP)

(*) Notice: Subject to any disclaimer, the term of this patent is extended or adjusted under 35 U.S.C. 154(b) by 0 days.

(21) Appl. No.: 09/926,347

(22) PCT Filed: Feb. 16, 2001

(86) PCT No.: PCT/JP01/01106

§ 371 (c)(1), (2), (4) Date: Oct. 17, 2001

(87) PCT Pub. No.: WO01/61368

PCT Pub. Date: Aug. 23, 2001

(65) Prior Publication Data

US 2002/0140445 A1 Oct. 3, 2002

(30) Foreign Application Priority Data

Feb. 18, 2000 (JP) ........................................ 2000-041610

(51) Int. Cl.⁷ .......................... G01R 31/02; H01R 31/02
(52) U.S. Cl. ...................................... 324/763; 324/537
(58) Field of Search ................................ 324/754–755, 324/760, 763, 765, 758; 269/53–54; 438/14–18

(56) References Cited

U.S. PATENT DOCUMENTS

| | | | | |
|---|---|---|---|---|
| 3,787,768 A | * | 1/1974 | Kubota et al. | 324/754 |
| 5,055,777 A | * | 10/1991 | Bonelli et al. | 324/754 |
| 5,173,451 A | * | 12/1992 | Kinsman et al. | 324/765 |
| 5,302,891 A | * | 4/1994 | Wood et al. | 324/754 |
| 5,702,255 A | * | 12/1997 | Murphy et al. | 439/71 |
| 5,791,914 A | * | 8/1998 | Loranger et al. | 439/71 |
| 6,018,249 A | * | 1/2000 | Akram et al. | 324/755 |
| 6,072,326 A | * | 6/2000 | Akram et al. | 324/755 |
| 6,097,202 A | * | 8/2000 | Takahashi | 324/761 |
| 6,229,320 B1 | * | 5/2001 | Haseyama et al. | 324/754 |
| 6,313,651 B1 | * | 11/2001 | Hembree et al. | 324/755 |
| 6,353,328 B2 | * | 3/2002 | Akram et al. | 324/755 |
| 6,373,273 B2 | * | 4/2002 | Akram et al. | 324/765 |
| 6,383,825 B1 | * | 5/2002 | Farnworth et al. | 324/755 |
| 6,400,169 B1 | * | 6/2002 | Hembree | 324/755 |
| 6,525,331 B1 | * | 2/2003 | Ngoi et al. | 250/559.34 |
| 6,734,692 B2 | * | 5/2004 | Fujii et al. | 324/763 |

FOREIGN PATENT DOCUMENTS

JP      2001-221824      8/2001

* cited by examiner

*Primary Examiner*—David Zarneke
*Assistant Examiner*—Jermele Hollington
(74) *Attorney, Agent, or Firm*—Westerman, Hattori, Daniels & Adrian, LLP

(57) ABSTRACT

An inspection apparatus is provided capable of adequately positioning an inspection chip to a conductive pattern as an inspection object. For connecting an electrode pad 1b of an inspection chip 1 with a lead 2a of a package 2, bump electrodes 3 and 4 are first provided at the inspection chip and at the package, respectively. Then, an anisotropic conductor 5 is provided to cover between the bump electrodes 3 and 4, and a conductor film 6 is provided on the anisotropic conductor 5 to extend between the bump electrodes 3 and 4. The anisotropic conductor 5 is thermo-compression bonded to provide an electrical connection between the conductor film 6 and the bump electrodes 3 and 4. This structure may provide a desirable surface of the inspection chip 1 having a sufficiently reduced thickness.

16 Claims, 14 Drawing Sheets

(a)

(b)

(a)

(b)

US 6,861,863 B2

INSPECTION APPARATUS FOR CONDUCTIVE PATTERNS OF A CIRCUIT BOARD, AND A HOLDER THEREOF

TECHNICAL FIELD

The present invention relates to an inspection apparatus used for inspecting a conductive pattern of a circuit board in a non-contact manner and a holder for the inspection apparatus. In particular, the present invention relates to a technique for packaging an inspection chip and an arrangement of the inspection chip.

BACKGROUND ART

In manufacturing processes of a circuit board, after forming electrically conductive patterns on a board, it is required to inspect the presence of disconnection and/or short-circuit in the conductive patterns.

As for such an inspection technique, a contact type inspection technique has been heretofore known in which a conductive pattern was subjected to a continuity check or the like by bringing two separate pins into contact with the opposed ends of the conductive pattern to apply an electric signal from one of the two pins to the conductive pattern and then receive the electric signal through the other pin.

However, recent progressive densification in the conductive patterns makes it difficult to bring the pins into contact with each of the conductive patterns from point to point precisely. Thus, a non-contact type inspection method has been proposed in which no pin was used at the receiving side and the electric signal was received without contacting the conductive pattern.

In this non-contact type inspection technique, a pin to be contacted to the conductive pattern is placed at one end of the conductive pattern, and a sensor is placed adjacent to the other end of the conductive pattern in a non-contact manner. Then, an electric signal having temporal variations is supplied to the pin, and a corresponding electric signal which appears at the sensor after passing through the capacitance lying between the conductive pattern and the sensor is detected to inspect the disconnection and others of the conductive pattern.

In the above technique, an inspection chip serving as the sensor is generally mounted on a package formed of an insulating material.

FIG. 15 is a schematic plan view showing a structure of a conventional inspection apparatus 100. FIG. 16 is a sectional view taken along the line X—X of FIG. 15.

The inspection apparatus 100 comprises a package 101, an inspection chip 102 mounted on the package 101, and an insulative film 104 provided on the surface of the inspection chip 102.

The package 101 includes a plurality of leads 101a each connected to a corresponding electrode pad 102a of the inspection chip 102 through a bonding wire 103. An associated device including a computer uses the leads 102 to communicate with the inspection chip 102. For example, the computer for controlling the inspection apparatus 100 inputs a control signal into the inspection chip 102 through the leads 101a and detects a signal from the inspection chip 102 through the leads 101a.

The inspection chip 102 is fixedly mounted within a recessed portion 101b of the package 101 with an adhesive or the like, and the inspection surface of the inspection chip 102 (the upper surface of the inspection chip 102 in FIG. 16) is arranged to be exposed outside the recessed portion 101b. A circuit board 200 as an inspection object is placed opposed to the inspection surface and above the top surface of the inspection apparatus 100.

In order to detect a signal from a conductive pattern of the circuit board 200 sufficiently, the film 104 protects the inspection surface of the inspection chip 102 and fills a gap between the circuit board 200 and the inspection chip 102, to provide a higher dielectric constant therebetween than that of an air layer otherwise existing.

On the other hand, as a desirable technique for obtaining an adequate signal from the conductive pattern, it is known to minimize the distance between the inspection surface of the inspection chip 102 and the conductive pattern, i.e., to dispose the inspection surface possibly close to the conductive pattern. Thus, in a design for packaging the inspection chip 102 to the package 101, the inspection surface of the inspection chip 102 is desirably exposed out of the inspection apparatus 100 as much as possible.

However, the conventional inspection apparatus 100 is involved with the problem in design that the inspection surface of the inspection chip 102 cannot be disposed sufficiently close to the conductive pattern as an inspection object, due to the bonding wire 103 for connecting the electrode pads 102a of the inspection chip 102 with the leads 101a of the package 101. This is caused by the necessity that the bonding wire 103 is bent not to contact the peripheral portion of the inspection chip 102. The above problem will be described with reference to FIG. 17, which shows a detail structure around the bonding wire 103 of FIG. 16.

The bonding wire 103 is partially formed in a chevron shape having a height h1 to provide a distance between the peripheral portion of the sensor chip 102 and the bonding wire 103. In this case, the electrode pads 102a and the bonding wire 103 are bonded with each other by an ultrasonic thermo-compression bonding process. In the course of this process, the bending strength of the bonding wire 103 is degraded by a eutectic reaction between a material (typically aluminum) of the electrode pads 102a and a material (typically gold) of the bonding wire 103. Thus, the height h1 is required to be about 150 mm or more to avoid bending failure.

As a result, it is required to provide a distance of at least the height h1 between the inspection surface of the inspection chip 102 and the circuit board 200. Additionally, a certain margin is necessary for avoiding an accidental interference between the top of the bonding wire 103 and the circuit board 200. Consequently, it will be necessary to provide a distance h2 (>h1) between the inspection surface of the inspection chip 102 and the circuit board 200.

Thus, the conventional inspection apparatus 100 has been involved with the problem in design that the inspection surface of the inspection chip 102 cannot be disposed sufficiently close to the conductive pattern.

Further, in order to obtain an adequate signal from the conductive pattern, during an operation of the inspection apparatus 100, the inspection apparatus 100 is desirably hold to allow the inspection surface of the inspection chip 102 to be arranged approximately in parallel with the conductive pattern.

It is therefore an object of the present invention to provide an inspection apparatus and a holder thereof, which allows the inspection chip to be positioned adequately to the conductive pattern as an inspection object.

DISCLOSURE OF INVENTION

According to one aspect of the present invention, there is provided an inspection apparatus comprising an inspection chip for inspecting a conductive pattern of a circuit board in a non-contact manner, an insulative package mounting the inspection chip thereon with allowing an inspection surface of the inspection chip to be exposed out of the insulative package, a chip-side bump electrode provided at each of electrode pads of the inspection chip, a package-side bump electrode provided at a lead of the package, an anisotropic conductor disposed to cover at least the chip-side bump electrode and the package-side bump electrode, and a conductor layer located on the anisotropic conductor and extending at least in the range of the chip-side bump electrode to the package-side bump electrode, wherein the anisotropic conductor is thermo-compression bonded in between the conductor layer and the chip-side bump electrode and in between the conductor layer and the package-side bump electrode, so as to electrically connect the chip-side bump electrode with the package-side bump electrode through the conductor layer.

According to another aspect of the present invention, there is provided a holder for holding an inspection apparatus including a packaged inspection chip for inspecting a conductive pattern of a circuit board in a non-contact manner, comprising a holding table, an elastic member provided at the top surface of the holding table and allowing the inspection apparatus to be placed thereon, and a holding member mounted on the holding table and having a claw for defining the upper limit position of the inspection apparatus placed on the elastic member.

According to still another aspect of the present invention, there is provided a holder for holding an inspection apparatus including a packaged inspection chip for inspecting a conductive pattern of a circuit board in a non-contact manner, comprising a holding table, an elastic member fixed on a top surface of the holding table, and an engaging member fixed on a top surface of the elastic member to retain the inspection apparatus.

According to yet another aspect of the present invention, there is provided a holder for an inspection apparatus, wherein the holder is adapted to hold an inspection apparatus including a packaged inspection chip for inspecting a conductive pattern of a circuit board in a non-contact manner, with keeping the inspection apparatus in a slanted position.

According to other aspect of the present invention, there is provided a holder for an inspection apparatus including a packaged inspection chip for inspecting a conductive pattern of a circuit board in a non-contact manner, comprising a holding table, a plurality of probes provided in the holding table and supporting the inspection apparatus with bringing each tip of the probes into contact with an electrode of the inspection apparatus, and a holding member mounted on the holding table and having a claw defining the upper limit position of the inspection apparatus placed on the elastic member, wherein each of the probe is elastically displaceably mounted on the inspection apparatus.

BRIEF DESCRIPTION OF THE DRAWINGS

FIG. 3 is an enlarged view of a partial structure for connecting between an electrode pad 1b and a lead 2a;

FIG. 7 shows an operational principal diagram of an inspection using the inspection chip 1, illustrating based on one cell 12a;

BEST MODE FOR CARRYING OUT THE INVENTION

Preferred embodiments of the present invention will now be described with reference to the appended drawings.

Figure 1:
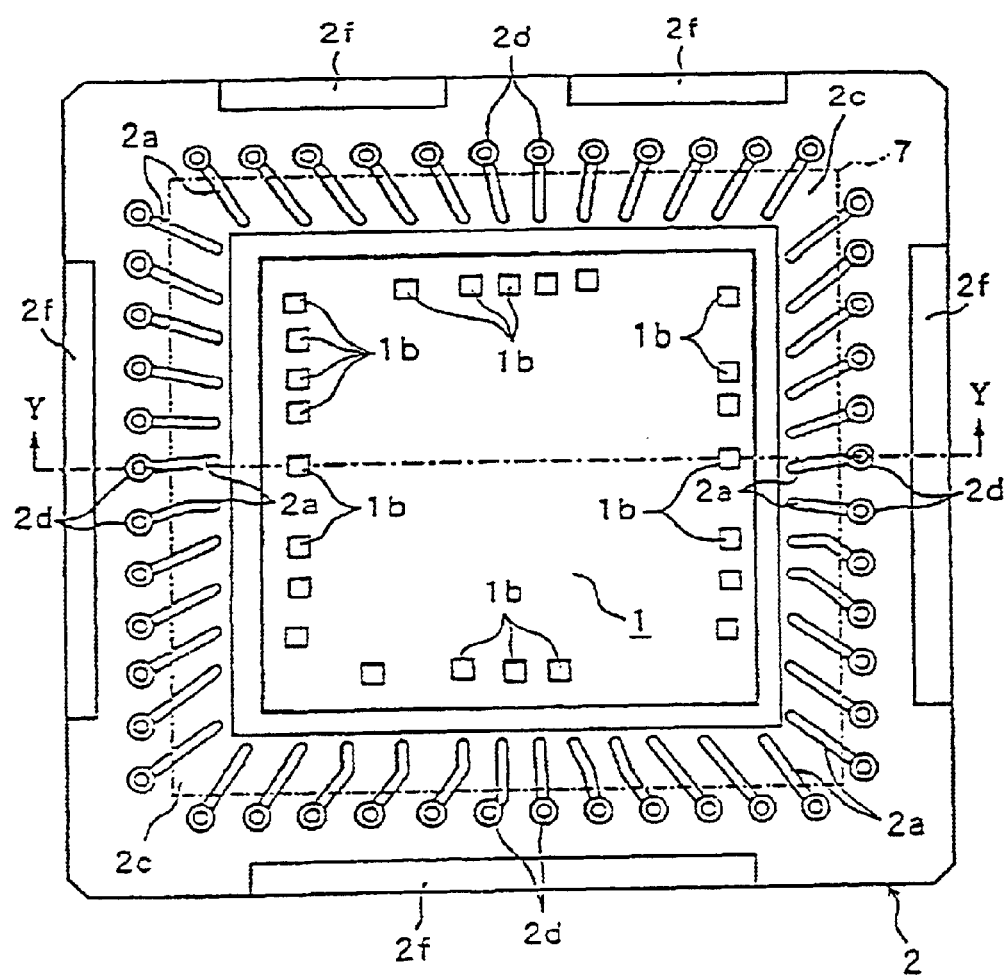
FIG. 1 is a schematic plan view of an inspection apparatus A according to one embodiment of the present invention.
Figure 2:
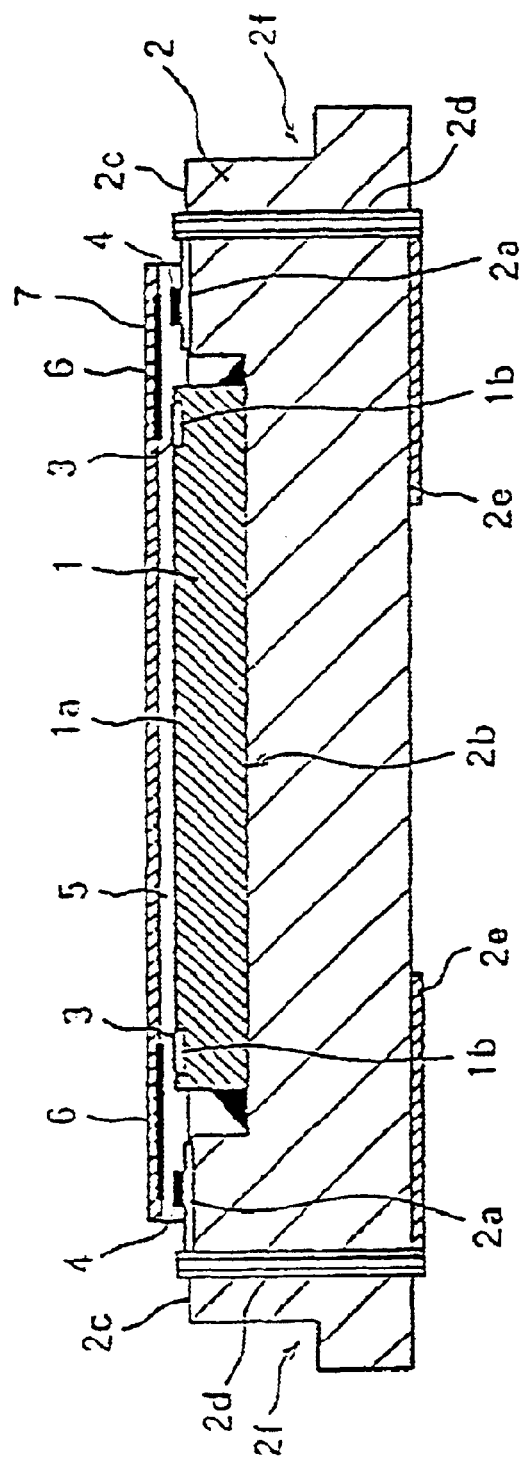
FIG. 2 is a sectional view taken along the line Y—Y of FIG. 1.

FIG. 1 is a schematic plan view (partially omitted) of an inspection apparatus A according to one embodiment of the present invention. FIG. 2 is a sectional view taken along the line Y—Y of FIG. 1.

The inspection apparatus A comprises an inspection chip 1, a package 2 mounting the inspection chip 1 with allowing the an inspection surface 1a of the inspection chip 1 to be exposed out of the package, a bump electrode 3 provided at each of electrode pads 1b of the inspection chip 1, a bump electrode 4 provided at each of leads 2a of the package 2, an anisotropic conductor 5 provided to cover at least the bump electrodes 3 and 4, a conductor film 6 provided to bridge or extend between the bump electrodes 3 and 4, and an insulative film 7.

The package 2 is formed of an insulative material, such as plastic or the like, and has a recessed portion 2b at the center region in the front surface of the package 2. The inspection chip 1 is embeddedly mounted in the recessed portion 2b. The end face 2c of the package provided with the leads 2a thereon is approximately flush with the front surface of the inspection chip 1 mounted on the package. This is done to approximately equalize the respective heights of the electrode pad 1b and the lead 2a.

Figure 4:
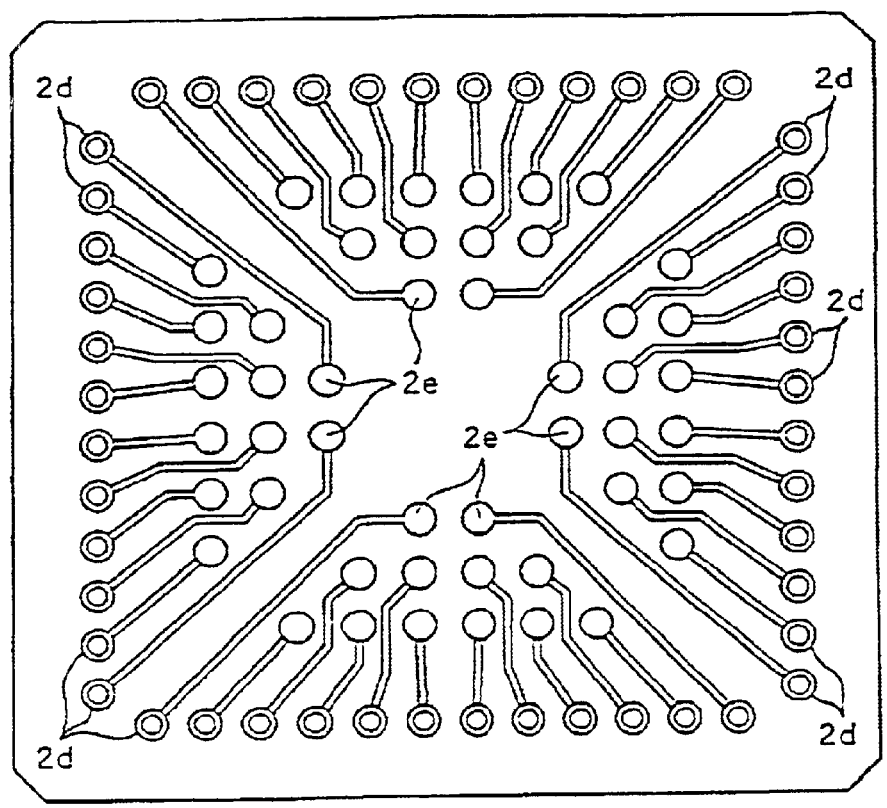
FIG. 4 is a view showing a rear surface of a package 2.

The package 2 also includes a through hole 2d connected to each of the leads 2 and penetrating from the front surface to the rear surface of the package. The through hole 2d is connected to an external electrode 2e which is provided on the rear surface of the package 2 and connected to an external computer and other peripheral devices. FIG. 4 shows the rear surface of the package 2. A plurality of external electrodes 2e each connected to the corresponding through hole 2d are provided on the rear surface of the package 2. The computer and other devices for performing the inspection operation by use of the inspection apparatus A supply a signal to each of the external electrodes 2e, or detect a signal from each of the external electrodes 2e to inspect a conductive pattern formed on a circuit board. Further, the side surface of the package 2 has a step-down portion 2f to lock the inspection apparatus A.

The inspection chip 1 is provided for inspecting the conductive pattern of the circuit board in a non-contact manner, and is fixed on the bottom of the recessed portion 2b of the package 2 with an adhesive or the like. The electrode pads 1b of the inspection chip 1 are provided on the front surface of the inspection chip 1, and are connected to an internal circuit of the inspection chip 1. The inspection chip 1 may be controlled by supplying a signal to the inspection chip 1 through the electrode pads 1b, or an inspection signal may be obtained by detecting a signal from the inspection chip 1.

The insulative film 7 is provided for protecting the inspection chip 1 and increasing the dielectric constant between the inspection surface 1a of the inspection chip 1 and the conductive pattern as an inspection object, but it is not always necessary.

Figure 3:
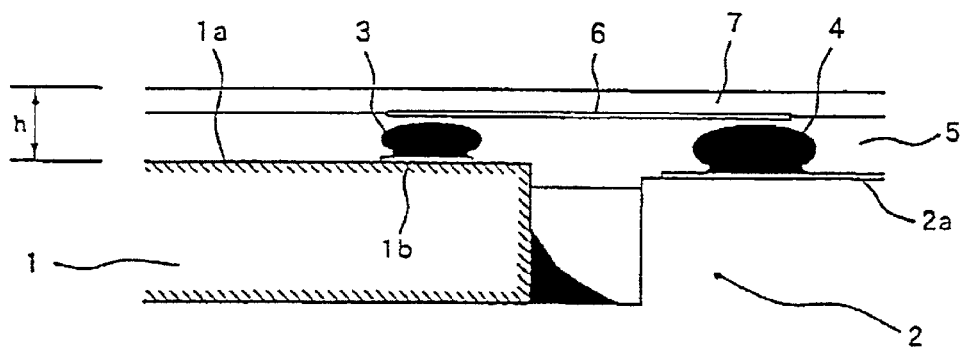

The connection structure between the electrode pad 1b of the inspection chip 1 and the lead 2a of the package 2 will now be described. FIG. 3 is an enlarged view showing a substantial part of the connection structure.

The bump electrode 3 is provided on the corresponding electrode pad 1b, and the bump electrode 4 is provided on the corresponding lead 2a. A bump formed of gold may be used as the bump electrodes 3 and 4.

The anisotropic conductor 5 is provided to cover the bump electrodes 3 and 4. The anisotropic conductor 5 is formed by mixing conductive fine particles with a resin material. The anisotropic conductor 5 has usually no conductivity. When the anisotropic conductor 5 is subjected to a thermo-compression bonding, it exhibits a sufficient conductivity only in the compressed direction of the anisotropic conductor 5.

Further, the conductor film 6 as a conductor layer is provided on the top surface of the anisotropic conductor 5 to bridge between the bump electrodes 3 and 4. The conductor film 6 may include a metal film having a suitable conductivity.

The anisotropic conductor 5 is thermo-compression bonded in between the conductor film 6 and the bump electrodes 3 and 4. As a result, between the bump electrode 3 and the conductor film 6 and between the bump electrode 4 and the conductor film 6, the conductive fine particles in the anisotropic conductor 5 contact both of the bump electrodes 3 or 4 and the conductor film 6, to provide an electrical connection therebetween and thereby establish an electrical connection between the bump electrodes 3 and 4.

On the other hand, by virtue of the presence of the anisotropic conductor 5 between the inspection chip 1 and the conductor film 6, the non-conductivity therebetween may be maintained to prevent any short-circuit therebetween.

In this case, it is unnecessary for the conductor film 6 to be bent as in the bonding wire. Actually, the conductor film 6 may be formed to have a sufficiently reduced thickness. This allows a distance h between the inspection surface 1a of the inspection chip 1 and the circuit board (not shown) to be designed in a sufficiently reduced value. More specifically, the distance h for the conventional bonding wire is 150 to 200 microns, whereas the example in FIG. 3 may provide a reduced distance of 50 microns.

A manufacturing process of the above connection structure will be described in brief. The bump electrodes 3 and 4 are first provided on the electrode pad 1b and the lead 2a, respectively (This operation may be carried out before the inspection chip 1 is mounted on the package 2). Then, the anisotropic conductor 5 is coated on the front surface of the package 2 to bury or embed at least the bump electrodes 3 and 4.

Then, the conductor film 6 is attached on the anisotropic conductor 5 to bridge or extend between the bump electrodes 3 and 4, and then the anisotropic conductor 5 is thermo-compression bonded to complete the manufacturing process. In this moment, even if the conductor film 6 accidentally contacts the bump electrode 3 or 4, no problem will be caused.

While, in the inspection apparatus A, the anisotropic conductor 5 is provided to cover the inspection surface 1a of the inspection chip 1, a desired effect may be sufficiently obtained if at least the bump electrodes 3 and 4 are covered by the anisotropic conductor 5. In this case, the bump electrodes 3 and 4 may also establish the electrical connection therebetween through the conductor film 6, and the short-circuit between the conductor film 6 and the inspection chip 1 may be prevented by the height of the bump electrodes 3 and 4 or the anisotropic conductor 5.

However, if the anisotropic conductor 5 is provided to extend at least in the range of the bump electrode 3 to the bump electrode 4, the anisotropic conductor 5 will be interposed between the conductor film 6 and the inspection chip 1 as described above, which provides a reliable protection against the short circuit therebetween.

In addition, in the manufacturing process, it is advantageous to provide the anisotropic conductor 5 to cover the inspection surface 1a because this eliminates the necessity of positioning each potion to be applied with the anisotropic conductor 5 or the like. Further, if the anisotropic conductor 5 exists on the inspection surface 1a, there is provided an additional advantage of improved dielectric constant between the inspection surface 1a and the circuit board.

Figure 5:
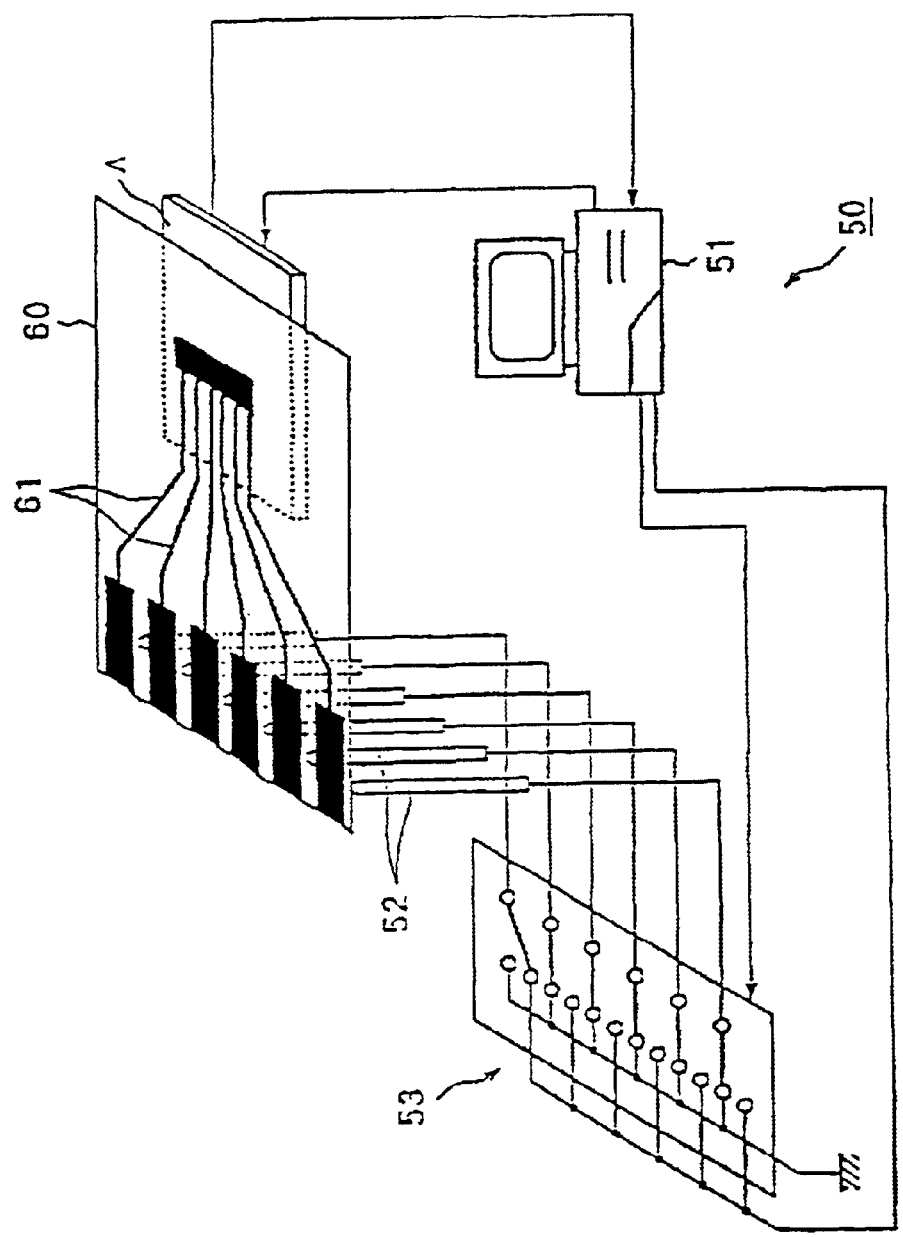
FIG. 5 is a schematic diagram of an inspection system 50.

One example of an inspection method of a conductive pattern using the inspection apparatus A will be described. FIG. 5 is a schematic diagram of an inspection system 50 using the inspection apparatus A.

The inspection system 50 is directed to inspect a conductive pattern 61 of a circuit board 60. The inspection system 50 comprises the inspection apparatus A, a computer 51, a plurality of probes 52 each supplying an inspection signal to the conductive pattern 61, and a switching device 53 for switching each supply of the inspection signal to the probes 52.

The computer 51 generates a control signal of the switching device 53 and the inspection signal, and detects a signal from the inspection apparatus A to determine a disconnection, short circuit, chipping and others of the conductive pattern 61.

The inspection apparatus A detects the inspection signal supplied to the conductive pattern 61 through the coupling capacitance between the conductive pattern 61 and inspection apparatus A, and sends the detected signal to the computer 51.

Figure 6:
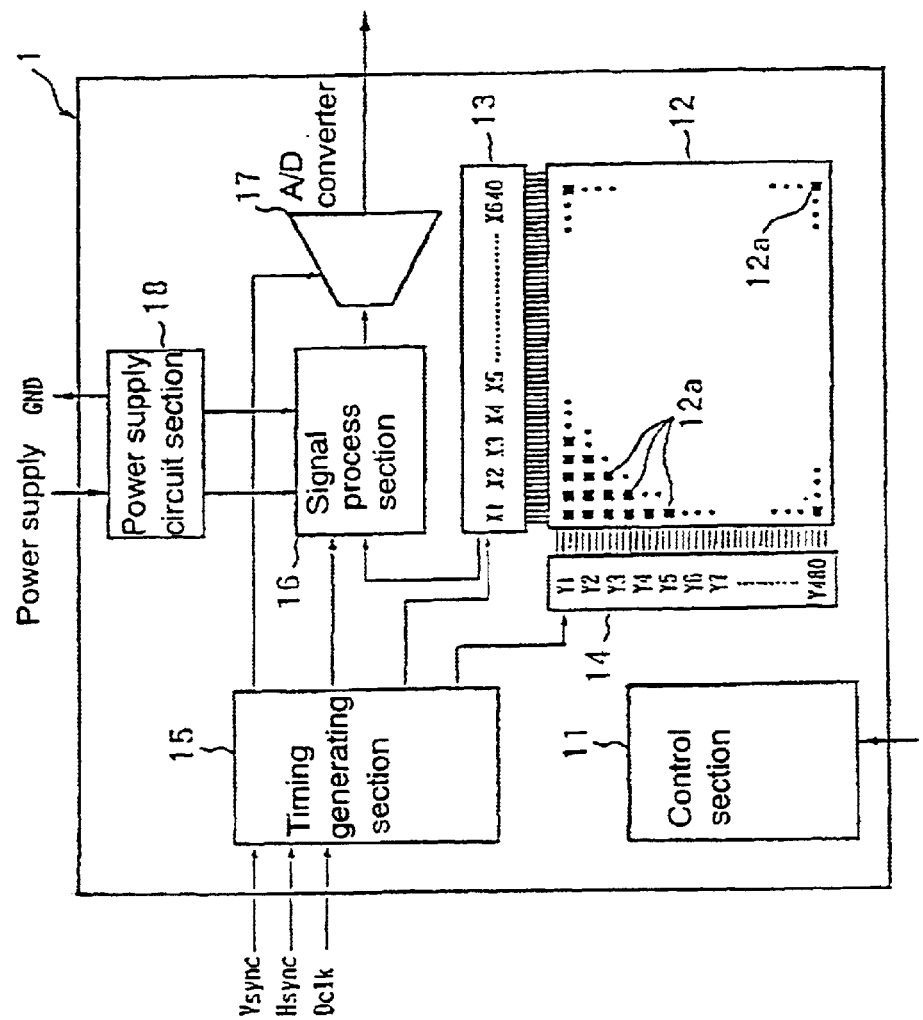
FIG. 6 is an internal block diagram of an inspection chip 1.

FIG. 6 is an internal block diagram of the inspection chip 1 of the inspection apparatus A.

The inspection chip 1 comprises a control section 11, a cell group 12 composed of a plurality of cells 12a, a column select section 14 to select the cell 12a, a row select section 13 to select the cell 12a and pickup a signal, a timing generating section 15 to generate a select signal for selecting each cell 12a, a signal processing section 16 to processing a signal from the row select section 13, an A/D converter 17 to A/D convert, and a power supply circuit section 18 to supply a power for driving the inspection chip 1.

The control section 11 controls the operation of the inspection chip 1 based upon the control signal from the computer 51.

The cells 12a are arranged in a matrix form (column 480×row 640) along the inspection surface 1a of the inspection chip 1, and detects in a non-contact manner the inspection signal supplied from the probe 52 to the conductive pattern 61.

The timing generating section 15 is supplied with a vertical synchronizing signal (Vsync), a horizontal synchronizing signal (Hsync), and a reference signal (Dclk) from the computer 51, and supplies a timing signal for determining the cell or cells 12a from which a signal is picked up, to the column select section 14 and the row select section 13.

The column select section 14 turns on at least one column of the cell group 12 based upon the timing signal from the timing generating section 15.

The row select section 13 sequentially transmits the inspection signal detected from each cell 12a to the signal processing section 16 in response to the timing signal from the timing generating section 15.

The signal processing section 16 performs a signal processing such as amplification or hold, and then transmits the conditioned signal to the A/D converter 17.

The A/D converter 17 converts the inspection signal of each cell 12a sent out of the signal processing section 16 in an analog form, into a digital signal, for example eight bits to output as a serial signal line. However, it is apparent that the analog signal from the signal processing section 16 may be output directly without passing it through the A/D converter 17.

In the above structure, the signal input/output and the power supply is performed through the electrode pad 1b of the inspection chip 1.

Figure 7:
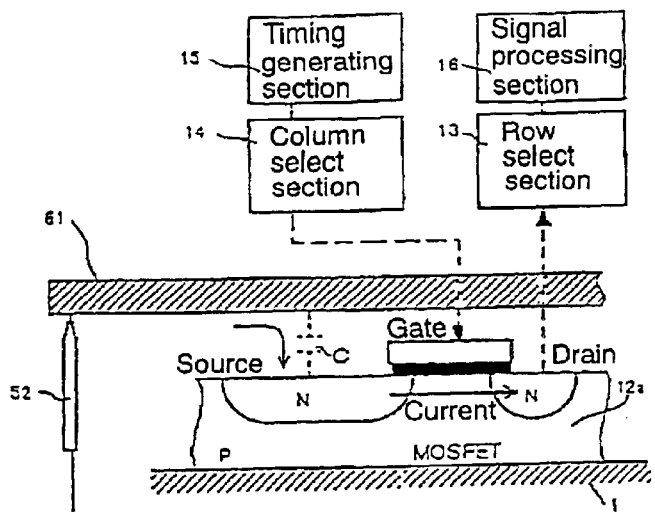

An operation of the inspection chip 1 will be described. FIG. 7 shows a principle of the inspection operation using the inspection chip 1, illustrating based on one cell 12a.

The cell 12a is a MOS type semiconductor element having a gate connected to the column select section 14 and a drain connected to the row select section 13. While a source of the cell 12a is usually open, it will be substantially connected through the conductive pattern 61 and the coupling capacitance C during the inspection operation.

When the cell 12a is selected by the timing generating section 15 through the column select section 14, a signal are sent from the column select section 14 to the gate to turn on the cell 12a.

In this moment, if an inspection signal is output from the probe 52, the signal is input into the source through the conductive pattern 61 and the coupling capacitance C, and then the drain outputs it to the row select section 13. The output inspection signal is conditioned in the signal processing section 16, and then is transmitted to the A/D converter 17. If no conductive pattern 61 exists on the cell 12a, the inspection signal will not be input into the source.

In the inspection system 50 having the above structured, an image data may be formed by using a signal detected from each cell 12a as each pixel signal in which a gradation is determined by the level of the conversion in the A/D converter 17, so as to display an image representing the shape of the conductive pattern 61. By observing the image, an inspector may identify the presence of a disconnection, short circuit, or chipping.

In this case, since the inspection apparatus A provides a sufficiently reduced distance between the inspection surface 1a of the inspection chip 1 and the conductive pattern 61, a clear and sharp image may be obtained. This point will now be described.

Figure 8:
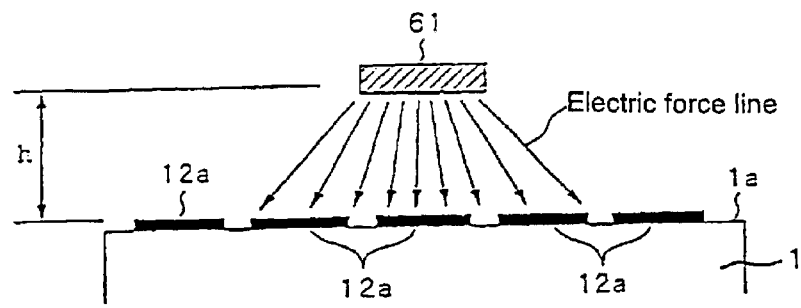
FIGS. 8(a) and 8(b) shows a state of a signal from a conductive pattern 61, wherein a distance from an inspection surface 1a to the conductive pattern 61 is relatively long.
Figure 8:
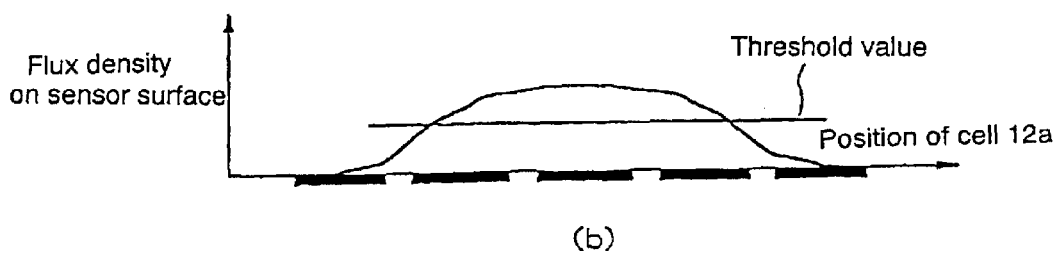

FIG. 8(a) shows a state of the diffusion in electric force lines from the conductive pattern 61 to each cell 12a, wherein the distance between the inspection surface 1a and the conductive pattern 61 is relatively long. FIG. 8(b) shows the intensity of the inspection signal appearing at each cell 12a in this case.

Figure 9:
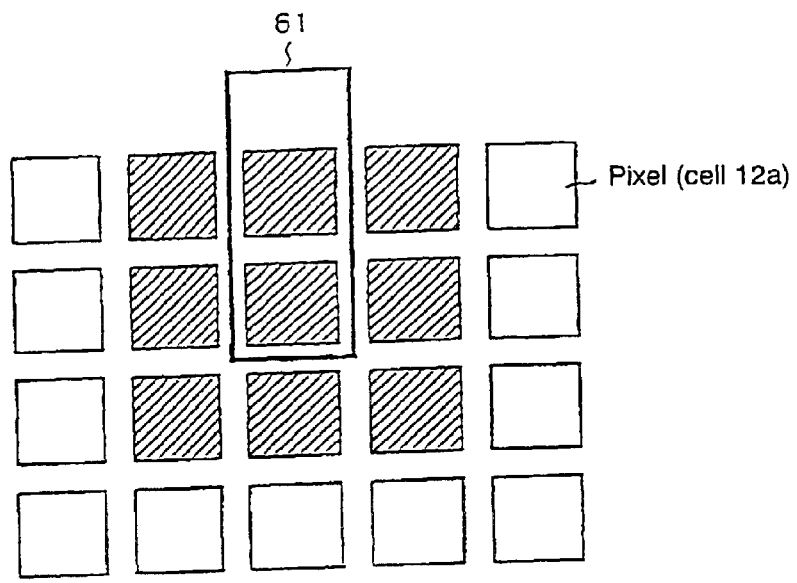
FIG. 9 shows an image of the conductive pattern 61 in FIG. 8.

As shown in FIG. 8(a), when the distance between the inspection surface 1a and the conductive pattern 61 is relatively long, another cells located around the cell 12a just under the conductive pattern 61 can inevitably detect the inspection signal. Thus, as shown in FIG. 9, if the image is formed by taking a threshold value as shown in FIG. 8(b) and using as a pixel signal the inspection signal from the cells 12a located approximately under the conductive pattern 61, the shape or profile of the conductive pattern 61 does not appear clearly and a somewhat indistinct image will be provided.

Figure 10:
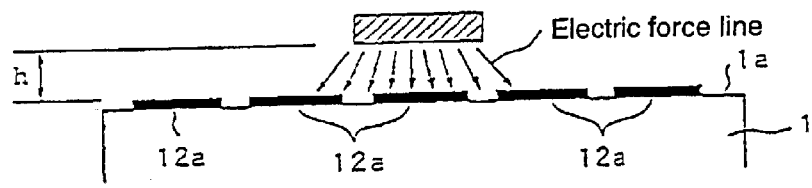
FIGS. 10(a) and 10(b) show a state of the signal from the conductive pattern 61, wherein the distance from the inspection surface 1a to the conductive pattern 61 is relatively short.
Figure 10:
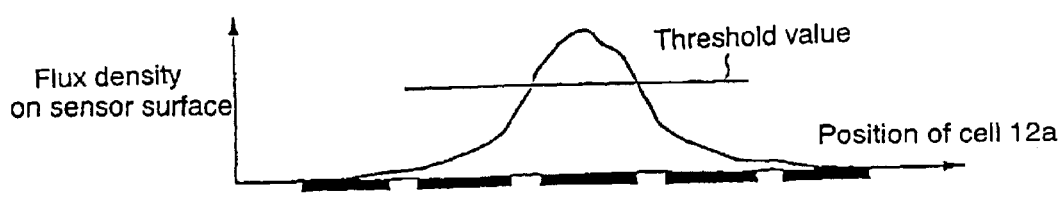

FIG. 10(a) shows a state of the diffusion in electric force lines from the conductive pattern 61 to each cell 12a, wherein the distance between the inspection surface 1a and the conductive pattern 61 is relatively short. FIG. 10(b) shows the intensity of the inspection signal appearing at each cell 12a in this case.

Figure 11:
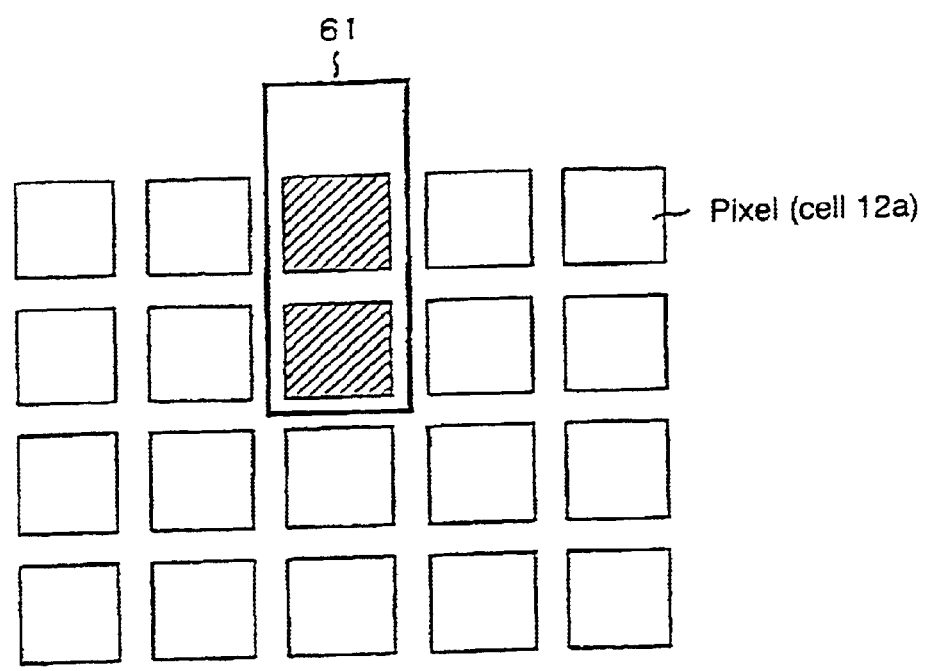
FIG. 11 shows an image of the conductive pattern 61 in FIG. 10.

As shown in FIG. 10(a), when a distance between the inspection surface 1a and the conductive pattern 61 is relatively short, it may be avoided that another cells located around the cell 12a just under the conductive pattern 61 undesirably detect the inspection signal. Thus, as shown in FIG. 11, if the image is formed by taking a threshold value as shown in FIG. 9(b) and using as a pixel signal the inspection signal from the cells 12a located approximately under the conductive pattern 61, the shape or profile of the conductive pattern 61 will appears clearly as the image.

Thus, the inspection apparatus A may be adapted to provide a sufficiently reduced distance between the inspection surface 1a and the conductive pattern and to arrange the cells 12a closer to the conductive pattern. This provides improved sensitivity of the cells 12a. In addition, when the signal detected by the cells 12a is used as a pixel signal for forming an image, the shape of the conductive pattern may be clearly indicated.

While, in the above embodiment, the cells 12a are used only to detect the signal from the conductive pattern 61, they may be used to supply an inspection signal to the conductive pattern 61 in a non-contact manner as a substrate for the probe 52 (for example, Japanese Patent Application No. 2000-33732 filed by the applicant), in addition to the above function.

A holder for adequately holding the inspection apparatus A with keeping the inspection apparatus A in a position opposed to the conductive pattern during the inspection operation.

Figure 12:
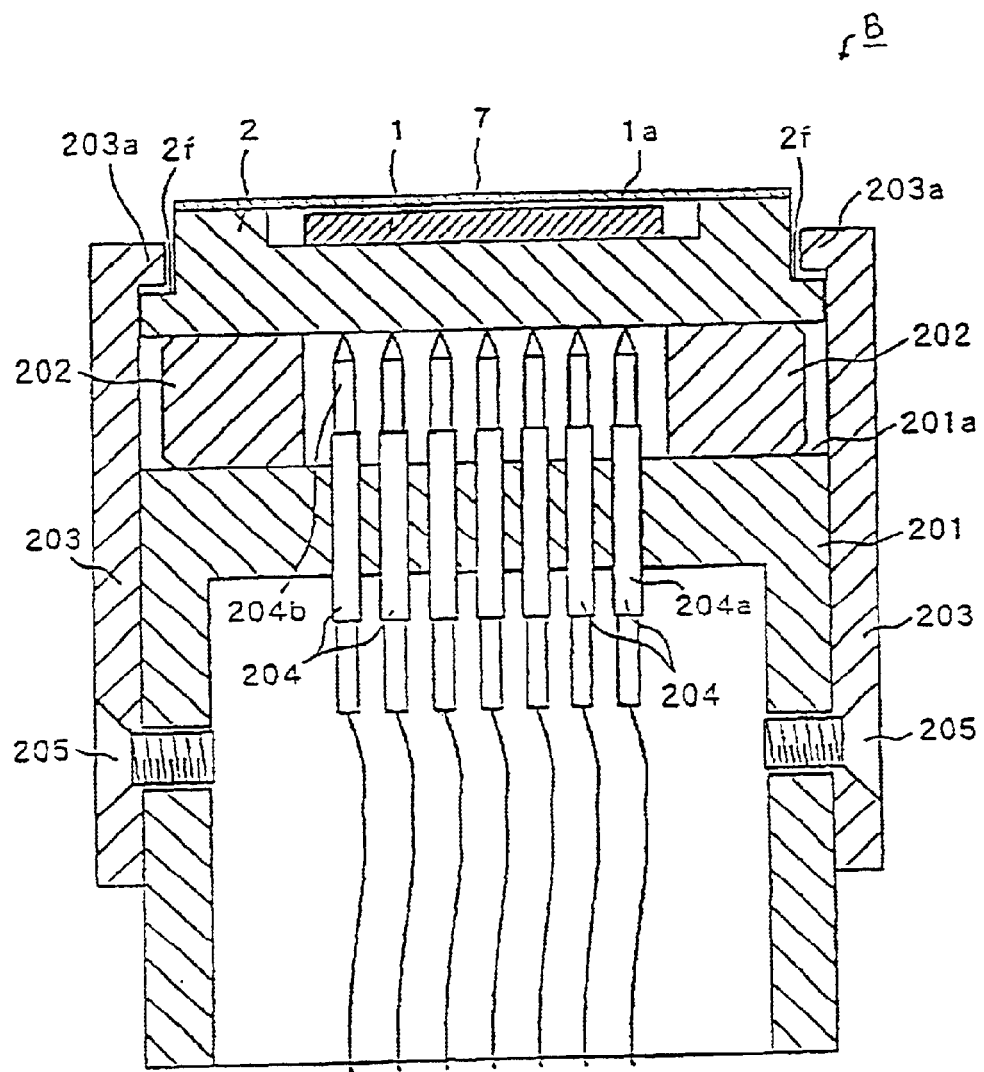
FIG. 12 is a sectional view showing a structure of a holder B according to one embodiment of the present invention.

FIG. 12 is a sectional view showing a structure of a holder B according to one embodiment of the present invention.

The holder B is directed to hold the inspection apparatus A. The holder B comprises a holding table 201, an elastic member 202 provided on a top surface 201a of the holding table 201 to mount the inspection apparatus A thereon, a holding member 203 mounted on the holding table 201 and having a claw 203a defining the upper limit position of the inspection apparatus A placed on the elastic member 202. The holder B also includes a plurality of resiliently displaceable probes 204 which are mounted on the holding table 201 and which penetrate through the elastic member 202 and then contact the corresponding external electrodes 2e (see FIG. 4) provided on the rear surface of the inspection apparatus A.

The holding table 201 has a hollow rectangular-column shape with a closed top surface 201a.

The elastic member 202 may support the inspection apparatus A with absorbing the inclination of the inspection apparatus A. The elastic member 202 may be formed of an elastic material, such as rubber, resin or sponge.

The holding member 203 is detachably fixed to the holding table 201 with a screw 205. The holding member 203 includes a reverse L-shaped claw 203a on the top end thereof. The upper limit position of the inspection apparatus A is defined by bringing the interior of the claw 203a into contact with the step-down portion 2f of the package 2 of the inspection apparatus A.

In this holder B, by virtue of the elastic member 202 and the holding member 203, the inspection apparatus A to be held is limited to move upward in FIG. 12 by the holding member 203, while the elastic member 202 allows the inspection apparatus A to move downward in a given range.

Figure 18:
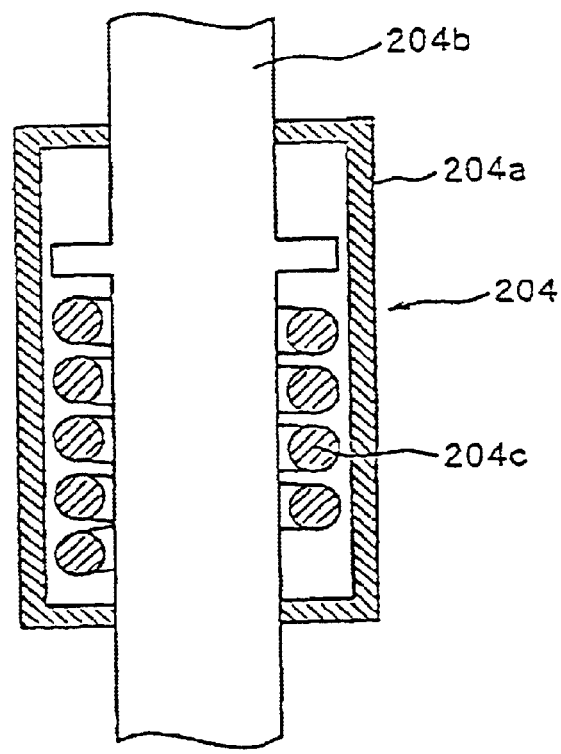
FIG. 18 is a view showing a structure of a probe 204.

As seen from FIG. 18 showing the interior structure of the probe 204, the probe 204 comprises a hollow cylindrical mounted shank 204a, probe body 204b, a spring 204c housed in the mounted shank 204a. The probe body 204b is movable or resiliently displaceable vertically to the mounted shank 204a against the bias force of the spring 204c. Thus, the tip of the probe body 204b may keep its contact to the external electrode 2e even if the inspection apparatus A is inclined.

In a normal use, the holder B having the above structure holds the inspection apparatus A by clamping it between the elastic member 202 and the claw 203a of the holding member 203, and the holder B presses the inspection apparatus A to the circuit board 60 having the conductive pattern 61 as an inspection object. In this operation, even if the inspection apparatus A is pressed in its oblique position to the circuit board 60, the elastic member 202 is resiliently deformed to hold the inspection apparatus A with keeping the inspection surface 1a of the inspection apparatus A approximately in parallel with the surface of the circuit board 60. In addition, since each of the probes 204 is extensible or telescopic, the probes 204 may keep their contacts with the external electrodes 2e even if the inspection apparatus A is inclined with respect to the holder B.

Figure 13:
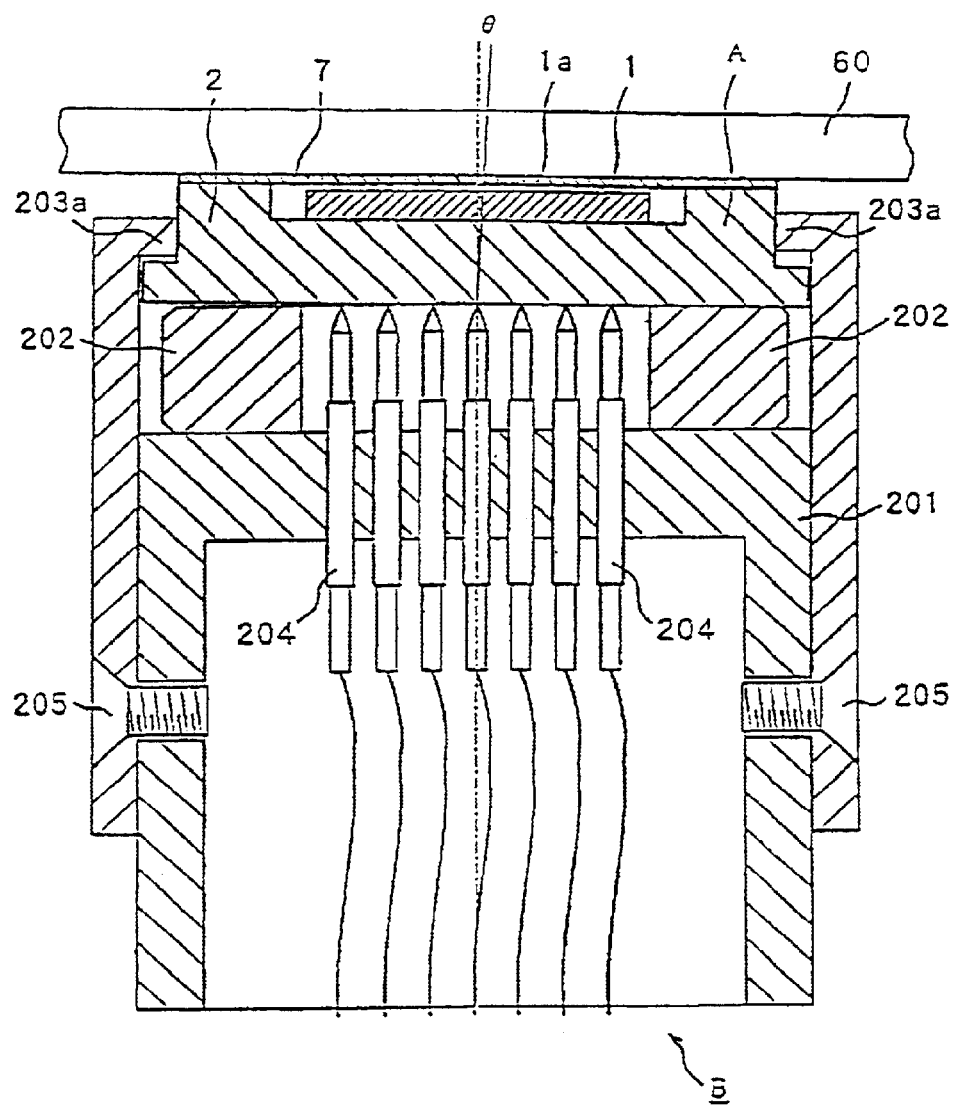
FIG. 13 shows a state in the use of the holder B.

FIG. 13 shows the state when the holder B is used. The inspection apparatus A is held with an oblique angle of corresponding to with the inclination of the circuit board.

According to this holder B, the inspection apparatus A may be held in conformity with the circuit board 60, and thereby all positions of the inspection surface 1a may have the same distance from the circuit board 60. As mentioned above, since the distance between the inspection surface 1a and the circuit board 60 has an impact on the sensitivity or the like of the inspection chip 1, the unevenness or deviation of the signal from each cell 12a may be reduced if all positions on the inspection surface 1a have the same distance from the circuit board 60.

In the holder B, the probe 204 may elastically deform. Thus, the probe 204 may additionally be used as the elastic member 202. In this case, the inspection apparatus A is arranged at and supported by the tip of the probe 204, and the elastic member 202 may be eliminated.

Figure 14:
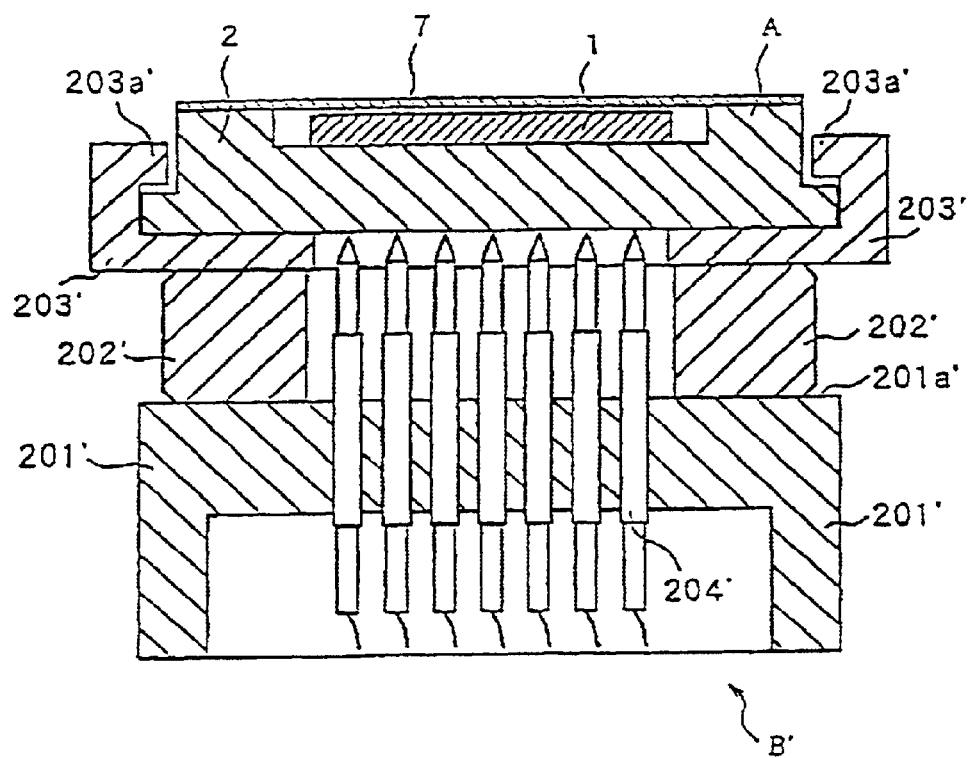
FIG. 14 is a sectional view showing a structure of a holder B' as another example.
Figure 15:
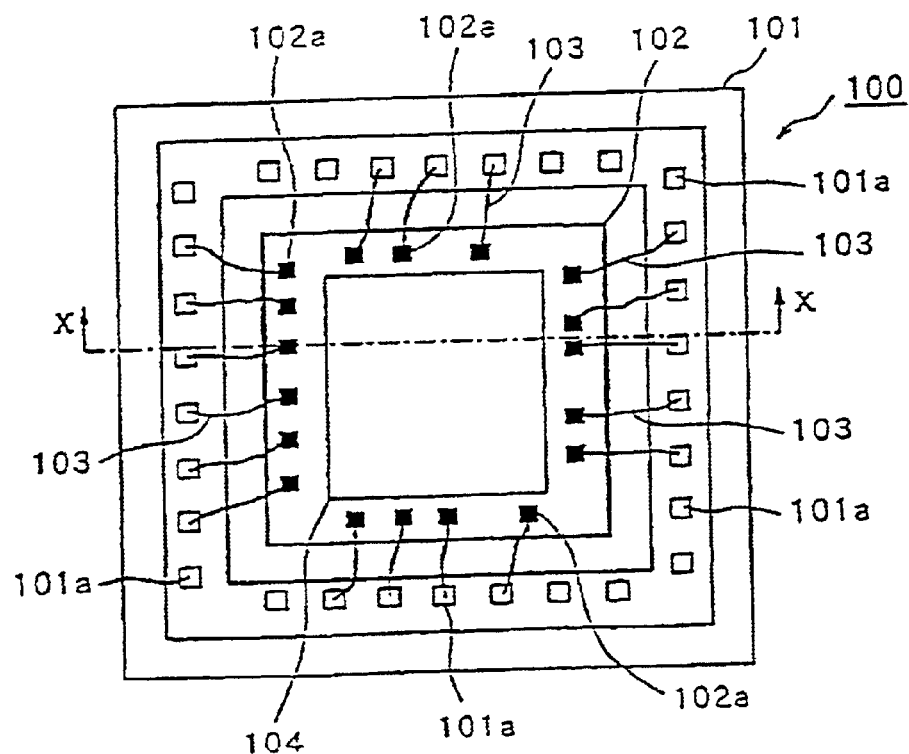
FIG. 15 is a schematic plan view of a structure of a conventional inspection apparatus 100.
Figure 16:
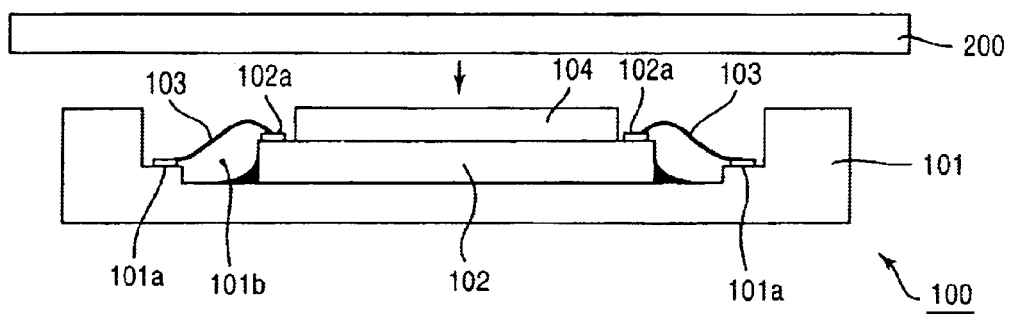
FIG. 16 is a sectional view taken along the line X—X of FIG. 15.
Figure 17:
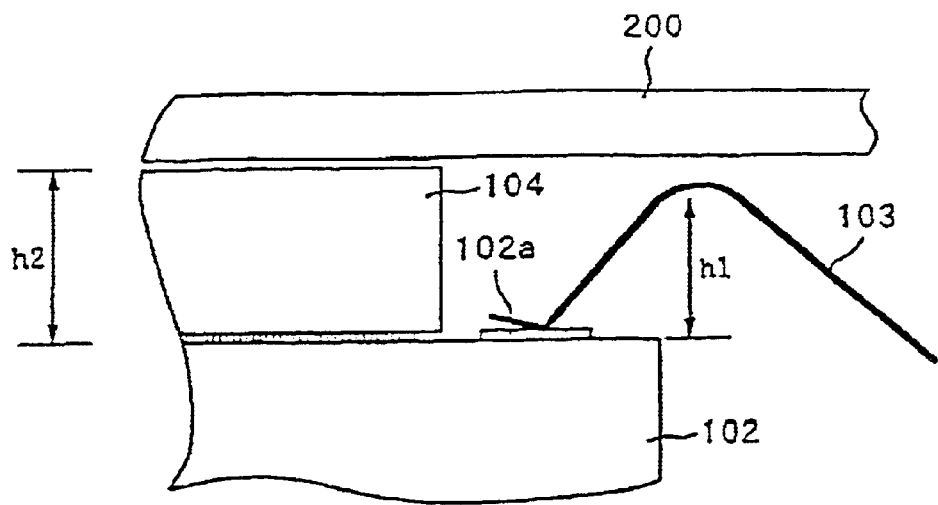
FIG. 17 shows a detail structure around a bonding wire 103 of FIG. 16.

The desired effect may be obtained if the holder B holds the inspection apparatus A in conformity with the circuit board 60. Thus, for example, a structure shown in FIG. 14 (a holder B') may be employed.

The holder B' is directed to hold the inspection apparatus A. The holder B' comprises a holding table 201', an elastic member 202' fixed on a top surface 201a' of the holding table 201', an engaging member 203' having a claw 203a' to lock or retain the inspection apparatus A, and a plurality of resiliently displaceable probes 204' which are mounted on the holding table 201' and which penetrate the elastic member 202' and the stopper member 203' to contact the external electrodes 2e (see FIG. 4) provided on the rear surface of the inspection apparatus A.

This holder B' holds the inspection apparatus A by retaining the inspection apparatus A with the engaging member 203'. As with the holder B, the holder B' usually presses the inspection apparatus A to the circuit board 60 having the conductive pattern 61 as an inspection object. Even if the inspection apparatus A is pressed in its oblique position to the circuit board 60, the elastic member 202' may be resiliently deformed to hold the inspection apparatus A with keeping the inspection surface 1a thereof approximately in parallel with the surface of the circuit board 60.

INDUSTRIAL APPLICABILITY

As described above, according to the present invention, the inspection chip may be adequately positioned to the conductive pattern as an inspection object.

What is claimed is:

1. An inspection apparatus comprising:
   an inspection chip for inspecting a conductive pattern of a circuit board in a non-contact manner;
   an insulative package mounting said inspection chip thereon with allowing an inspection surface of said inspection chip to be exposed out of said insulative package;
   a chip-side bump electrode provided at each of electrode pads of said inspection chip;
   a package-side bump electrode provided at a lead of said package;
   an anisotropic conductor disposed to cover at least said chip-side bump electrode and said package-side bump electrode; and
   a conductor layer located on said anisotropic conductor and extending at least in the range of said chip-side bump electrode to said package-side bump electrode, wherein said anisotropic conductor is thermo-compression bonded in between said conductor layer and said chip-side bump electrode and in between said conductor layer and said package-side bump electrode, so as to electrically connect said chip-side bump electrode with said package-side bump electrode through said conductor layer.

2. An inspection apparatus as defined in claim 1, wherein said package includes a recessed portion on the front surface side thereof, wherein said inspection chip is embeddedly mounted in said recessed portion.

3. An inspection apparatus as defined in claim 2, wherein said package has an end face on the front surface side thereof approximately flush with said inspection surface of said inspection chip.

4. An inspection apparatus as defined in claim 1, wherein said anisotropic conductor is disposed to extend from said chip-side bump electrode to said package-side bump electrode.

5. An inspection apparatus as defined in claim 1, wherein said anisotropic conductor is disposed to approximately cover the entire front surface of said inspection chip.

6. An inspection apparatus as defined in claim 1, wherein said conductor layer is composed of a conductor film formed in a planar shape and approximately in parallel with said inspection surface of said inspection chip.

7. An inspection apparatus as defined in claim 1, which further includes an insulative film disposed to cover approximately the entire front surface of said inspection chip.

8. An inspection apparatus as defined in claim 1, wherein said package includes a through hole penetrating from the front surface to the rear surface of said package, and an external electrode provided at said rear surface, wherein said lead is electrically connected to said external electrode through said through hole.

9. An inspection apparatus comprising:
  an inspection chip for inspecting a conductive pattern of a circuit board in a non-contact manner;
  an insulative package mounting said inspection chip thereon with allowing an inspection surface of said inspection chip to be exposed out of said insulative package;
  a chip-side bump electrode provided at each of electrode pads of said inspection chip;
  a package-side bump electrode provided at a lead of said package;
  an anisotropic conductor disposed to cover at least said chip-side bump electrode and said package-side bump electrode; and
  a conductor layer located on said anisotropic conductor and extending at least in the range of said chip-side bump electrode to said package-side bump electrode, wherein said anisotropic conductor is thermo-compression bonded in between said conductor layer and said chip-side bump electrode and in between said conductor layer and said package-side bump electrode, so as to electrically connect said chip-side bump electrode with said package-side bump electrode through said conductor layer, wherein an inspection signal applied to said conductive pattern is detected through a coupling capacitance lying between said inspection chip and said conductive pattern.

10. An inspection apparatus as defined in claim 9, wherein said inspection chip includes a plurality of sensor elements for detecting said inspection signal, wherein an image data for one pixel is generated base on one of said sensor elements.

11. A holder for holding an inspection apparatus, said holder comprising:
  a holding table;
  an elastic member provided on the holding table;
  a holding member mounted on the holding table; and
  a claw provided on the holding member;
  wherein the inspection apparatus, having a step down portion at an upper surface of the inspection apparatus, is held on the elastic member, engaging the step down portion with the claw, and wherein the inspection apparatus has an external electrode on the outside surface thereof, thereby inspecting a conducting pattern of a circuit board in the inspection apparatus in a non-contact manner.

12. A holder as defined in claim 11, wherein said claw is adapted to contact a part of said inspection apparatus so as to define said upper limit position.

13. A holder as defined in claim 11, which further includes a probe mounted on said holding table and penetrating said elastic member to contact an electrode provided in said inspection apparatus, said probe being elastically displaceably mounted on said inspection apparatus.

14. A holder for holding an inspection apparatus, said holder comprising:
  a holding table;
  an elastic member provided on the holding table; and
  an engaging member provided on an upper surface of the elastic member
  wherein the inspection apparatus, having a step down portion at an upper surface of the inspection apparatus, is held on the elastic member, engaging the step down portion with the engaging member, and wherein the inspection apparatus has an external electrode on the outside surface thereof, thereby inspecting a conducting pattern of a circuit board in the inspection apparatus in a non-contact manner.

15. A holder for an inspection apparatus as defined in claim 14, wherein said holder is adapted to hold said inspection apparatus with keeping said inspection apparatus in a slanted position, said inspection apparatus including a packaged inspection chip for inspecting a conductive pattern of the circuit board in said non-contact manner.

16. A holder for holding an inspection apparatus, said holder comprising:
  a holding table;
  an elastic member provided on the holding table;
  a probe mounted on the holding table to extend to the upper surface of the elastic member;
  a holding member mounted on the holding table; and
  a claw provided on the holding member;
  wherein the inspection apparatus, having a step down portion at an upper surface of the inspection apparatus, is held on the elastic member, engaging the step down portion with the claw, wherein the inspection apparatus has an external electrode on the outside surface thereof, and wherein the external electrode contacts the probe, thereby inspecting a conducting pattern of a circuit board in the inspection apparatus in a non-contact manner.

* * * * *